United States Patent [19]

Kaufman

[11] Patent Number: 4,488,202

[45] Date of Patent: Dec. 11, 1984

[54] LEAD FRAME CONNECTOR FOR COMPACT CIRCUIT PACKAGE

[76] Inventor: Lance R. Kaufman, 131 White Oak Way, Mequon, Wis. 53092

[21] Appl. No.: 608,930

[22] Filed: May 11, 1984

Related U.S. Application Data

[63] Continuation of Ser. No. 353,173, Mar. 1, 1982, abandoned.

[51] Int. Cl.³ .............................................. H05K 7/20
[52] U.S. Cl. ..................................... 361/386; 357/81; 361/399; 361/412
[58] Field of Search ....................... 219/522, 541, 203; 174/16 HS; 357/79, 81; 361/386–388, 399, 400, 403–405, 412, 418, 421, 395

[56] References Cited

U.S. PATENT DOCUMENTS

| | | | |
|---|---|---|---|
| 3,501,598 | 3/1970 | Lis | 361/412 |
| 3,801,728 | 4/1974 | Gallo, Jr. | 174/525 |
| 3,958,075 | 5/1976 | Kaufman . | |
| 4,156,148 | 5/1979 | Kaufman . | |
| 4,196,411 | 4/1980 | Kaufman . | |
| 4,215,235 | 7/1980 | Kaufman . | |
| 4,218,724 | 8/1980 | Kaufman | 361/412 |
| 4,250,481 | 2/1981 | Kaufman . | |
| 4,257,091 | 3/1981 | Kaufman . | |
| 4,266,140 | 5/1981 | Kaufman . | |
| 4,394,530 | 7/1983 | Kaufman . | |

OTHER PUBLICATIONS

Power Hybrid Module, Liv, Wright, IBM Tech. Discl. Bull., vol. 16, No. 11, Apr. 1974, pp. 3826, 3827.

Primary Examiner—G. P. Tolin
Attorney, Agent, or Firm—Andrus, Sceales, Starke & Sawall

[57] ABSTRACT

A compact circuit package (11) includes a lead frame connector (25) which is connected to maintain an electrically insulating substrate (40) in spaced relationship with respect to an electrically insulating, heat conducting substrate (22) and an internal wall (14) provided by a surrounding housing (12). One of the substrates (22) is connected to the housing (12) to substantially enclose the other substrate (40) and associated circuitry (43, 44) within a cavity (17). Certain lead frame extensions (32, 32') provide external access to selected circuits (23, 43, 44) while electrical connections (55, 56) provide selective electrical connections between outer portions (50) of certain lead frame extensions (31, 31') and selected circuits (43, 44).

8 Claims, 7 Drawing Figures

U.S. Patent  Dec. 11, 1984  4,488,202
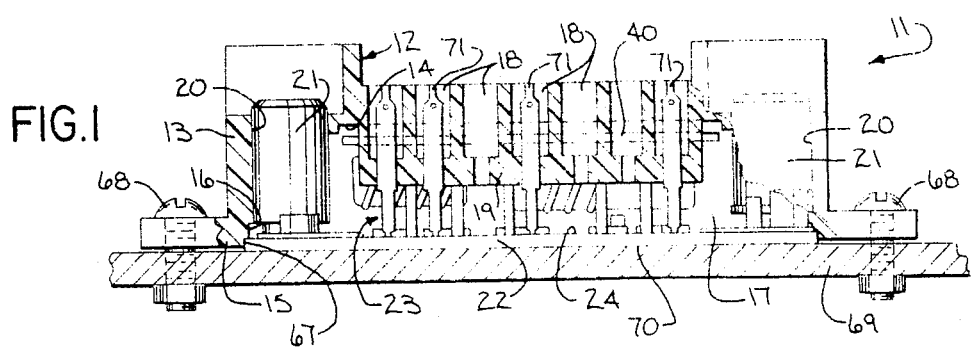
FIG.1
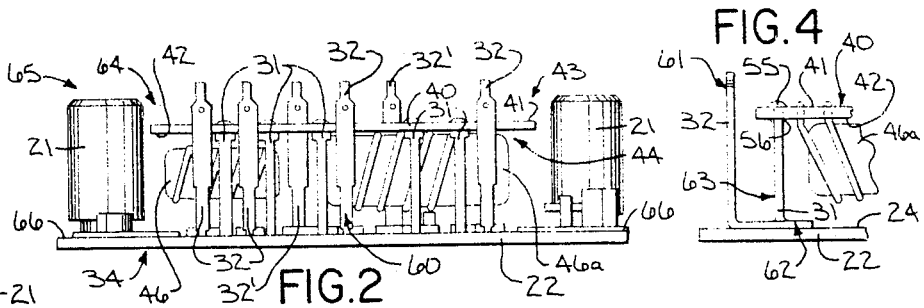
FIG.2
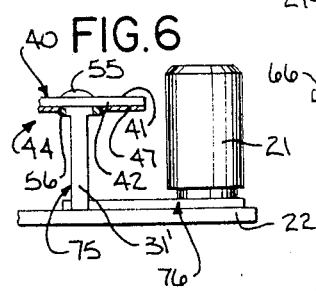
FIG.6
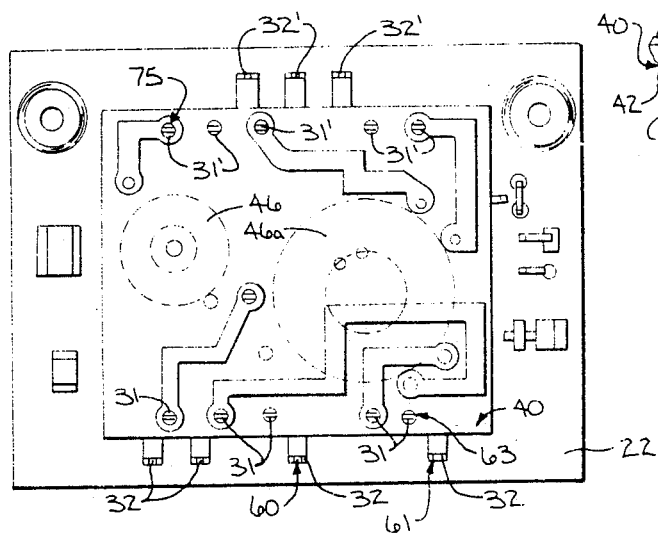
FIG.3
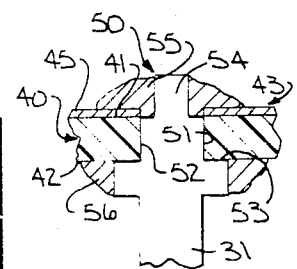
FIG.4
FIG.5
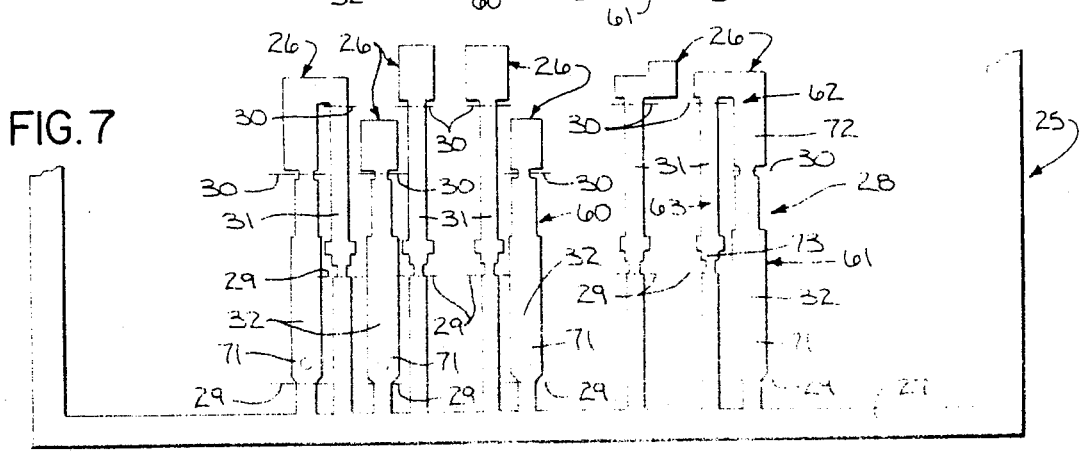
FIG.7

LEAD FRAME CONNECTOR FOR COMPACT CIRCUIT PACKAGE

This is a continuation of application Ser. No. 353,173, filed Mar. 1, 1982, now abandoned.

BACKGROUND OF THE INVENTION

This invention relates to a lead frame connector for a compact circuit package and particularly to a lead frame connector providing plural functions such as conducting operating electrical energy to plural electrical circuits located at plural substrates which are maintained in spaced relationship by the lead frame connector.

Lead frames and thick film circuits have been advantageously employed with respect to heat conducting, electrically insulating substrates. In many constructions, a lead frame sub-assembly is placed upon solder paste or conductive epoxy located on the insulating substrate. The intervening solder or epoxy is reflowed by heat or other means to permanently bond portions of the lead frame sub-assembly to the substrate. In addition, other discrete components may be placed upon certain portions of the lead frame sub-assembly or upon portions of the thick film circuit and permanently bonded thereto by reflowing the interconnected solder paste or conductive epoxy. Portions of the lead frame sub-assembly may be detached so that a sub-assembly is formed which includes the insulating substrate and a series of lead frame portions which are each bonded to the substrate by the reflowed solder or conductive epoxy. Portions of the lead frame may be bent normal to the substrate to form electrical terminal connections which may function to conduct large amounts of current to operating circuits which may include various components such as high power conducting semi-conductor devices. Such construction is particularly useful in high power energy conversions such as employed with electric motor drives or the like. One highly desirable construction is shown in the U.S. Pat. No. 3,958,075 entitled "High Power Thick Film Circuit With Overlapping Lead Frame", which issued on May 18, 1976 to Lance R. Kaufman.

In one deisrable construction, one or more lead frame connectors are bonded to a pair of spaced substrates lying in the same plane with the lead frame connectors thereafter bent into U-shaped configurations so that one portion of each lead frame connector and attached substrate is spaced in parallel with another portion of the lead frame connector and attached second substrate. Such construction has been found to be highly desirable in positioning a photon emitting control element in spaced relationship with a photon activated switch operating in a solid state power control device, such as shown in the U.S. Pat. No. 4,156,148 entitled "Photocoupling Structure For A Solid State Power Control Device", which issued on May 22, 1979 to Lance R. Kaufman.

Sub-assemblies including lead frames attached to an insulating substrate have been advantageously placed within an insulating housing. Such housings have included a cavity surrounded by one or more edges which engage the substrate to limit its depth of entry into the cavity. The use of such limiting edge avoids pressure being placed upon the circuit elements to permit thermal contraction and expansion of the circuit elements in response to heat generated by the conducted electrical energy. Such thermal expansion and contraction is particularly desirable in high power conducting solid state devices such as thyristors or the like. One highly desirable device is shown in U.S. application Ser. No. 834,601 entitled "Power Switching Device Having Improved Heat Dissipation Means", which was filed on Sept. 19, 1977 by Lance R. Kaufman.

Plural electrically insulating substrates each containing respective interconnected lead frame connectors have been advantageously employed within a compact circuit package. Under certain conditions, selected lead frame connectors which are mounted to one substrate engage selected lead frame connectors mounted to another substrate at or within housing apertures providing external electrical connection to such lead frame connectors. One desirable construction is shown in U.S. Pat. No. 4,218,724 entitled "Compact Circuit Package Having Improved Circuit Connectors", which issued on Aug. 19, 1980 to Lance R. Kaufman.

Compact circuit packages are capable of retaining a wide variety of circuit constructions mounted upon one or more of the substrates. By way of example, an electrical power converting thyristor firing circuit could be used, such as disclosed in U.S. Pat. No. 4,257,091 entitled "Electrical Power Converter Thyristor Firing Circuit Having Noise Immunity", which issued on Mar. 17, 1981 to Lance R. Kaufman. Optically couplable circuit elements could be used as shown in U.S. Pat. No. 4,266,140 entitled "Positioning Means For Optically Couplable Circuit Elements", which issued on May 5, 1981 to Lance R. Kaufman. One or more terminals could be used for the main input and output power connections such as disclosed in U.S. Pat. No. 4,215,235 entitled "Lead Frame Terminal", which issued on Jul. 29, 1980 to Lance R. Kaufman. One or more variable resistance devices could be used such as disclosed in U.S. Pat. No. 4,250,481 entitled "Variable Resistance Device For Thick Film Circuitry", which issued on Feb. 10, 1981 to Lance R. Kaufman. One or more dual resistor elements could be used such as disclosed in U.S. Pat. No. 4,196,411 entitled "Dual Resistor Element", which issued on Apr. 1, 1980 to Lance R. Kaufman. Numerous other circuits and elements could also be utilized.

SUMMARY OF INVENTION

A compact circuit package provides a lead frame connector providing a multiplicity of functions. One lead frame extension provides a circuit interconnection between first and second electrical circuits located upon spaced first and second substrates, respectively, while further functioning to maintain the spacing between such substrates. Another lead frame extension is connected to one of the substrates and is spaced from the other substrate and extends through an aperture within the housing to provide an external electrical connection for the circuit package.

The lead frame connector is advantageously utilized to simplify the construction of the compact circuit package which may be formed to provide a multiplicity of circuit constructions. For example, a first substrate may contain a first series of electrical circuits such as power conducting thyristors or the like located upon a first side. Such first substrate is specially constructed to provide a side edge which engages one or more ledges formed in the peripheral housing wall surrounding a cavity within a base plate of the housing. When assembled, the ledge limits the depth of entry of the first substrate to thereby substantially enclose the cavity and the first series of circuits located at or near the substrate first side. In such manner, heat generated by the first circuit, which may include thyristors or the like, is permitted to pass through the first substrate to be withdrawn from the substantially enclosed cavity.

The lead frame is operatively connected to the first substrate first side for operatively conducting electrical energy to and between the first series of electrical circuits. Such lead frame includes a first series of lead frame extensions which extend normally from the first substrate into the cavity and includes outer portions which protrude through corresponding apertures within the housing to provide external electrical access to the circuit sub-assembly. A second series of lead frame extensions also extend normally from the first substrate but terminate within the cavity. The second electrically insulating substantially planar substrate is spaced from the first substrate to be located within the cavity. The second substrate includes oppositely spaced first and second sides, at least one of which retains a second series of electrical circuits, such as printed circuits, discrete components or the like. The second series of lead frame extensions each provide a ledge which engages the second substrate to maintain the first and second substrates in spaced relationship with respect to each other. An outer end projection of each of the second series of lead frame extensions extends beyond the ledge to be located within a corresponding opening within the second substrate. A connection is made between the second series of lead frame extensions and the second substrate to retain the first and second substrates in spaced relationship with respect to the housing and to electrically connect the second lead frame extensions to the second circuit to provide a compact circuit module which provides a significant transfer of electrical energy.

In one construction, a first connector electrically connects a selected number of the second lead frame extensions to the second circuits located at a first side of the second substrate while a second connector electrically connects a second selected number of the second lead frame extensions to the second circuits located at a second side of the second substrate.

The lead frame connector may include an integral lead frame portion which interconnects the first and second lead frame extensions so that an external electrical connection is provided to the first and second circuits located at the first and second substrates, respectively. In addition, a first portion of one of the second lead frame extensions may be connected to a main power terminal while the corresponding second portion may be connected to one of the first and second circuits to conduct operating power to the compact circuit module.

The lead frame connector provides a multiplicity of functions in a unique construction which reduces the expense of manufacture while providing superb operating characteristics by conducting substantial amounts of electrical energy to and between a large plurality of circuits while further enhancing the efficiency by the withdrawal of substantial amounts of generated heat within a substantially enclosed circuit module.

BRIEF DESCRIPTION OF THE DRAWINGS

FIG. 1 is a side elevational view of a compact circuit package with parts broken away and showing a portion of a sub-assembly containing elements of a lead frame connector;

FIG. 2 is a side elevational view of the sub-assembly of FIG. 1 and including spaced substrates interconnected by portions of the lead frame connector;

FIG. 3 is a plan view of the sub-assembly of FIG. 2;

FIG. 4 is an end view of a portion of the sub-assembly of FIG. 2 and diagramatically illustrates a portion of the lead frame connector electrically connected to the pair of spaced substrates;

FIG. 5 is a side view with parts broken away of a portion of the sub-assembly of FIG. 2 and diagramatically illustrates a connector joining a portion of a lead frame extension to a first circuit of one substrate;

FIG. 6 is a side view with parts broken away of a portion of the sub-assembly of FIG. 2 and diagramatically illustrates another connector joining a portion of a lead frame extension to a second circuit located upon the substrate of FIG. 5; and FIG. 7 is a plan view of a portion of the lead frame connector sub-assembly prior to connection to a substrate.

DESCRIPTION OF THE PREFERRED EMBODIMENT

A compact circuit package 11 includes a housing 12 formed of an electrically insulating material. A base plate 13 of housing 12 includes an inner wall surface 14 spaced from a substantially rectangular rim 15 by a peripheral wall 16. The internal wall 14 and surrounding peripheral wall 16 form a cavity 17 to receive electrical circuits therein. The housing 12 includes a series of access openings 18 which permit external access to the cavity 17. The access openings 18 are formed in an extended portion 19 of base surface 14 located along opposite peripheral side walls 16, as more fully illustrated in the U.S. Pat. No. 4,218,724. A pair of spaced terminal openings 20 are located at opposite ends of housing 12 for receiving main power terminals 21.

A first substrate 22 is formed of electrically insulating, heat conducting material which may include a ceramic sheet or any other material providing good electrically insulating, heat conducting properties. A first series of electrical circuits 23 are connected to a first side 24 of substrate 22. One type of circuit member includes a specially designed lead frame connector 25 which includes a multiplicity of circuit elements which are preformed from copper or other good electrically conductive metal.

The lead frame connector 25 includes a series of lead frame portions 26 which are placed upon surface 24 of substrate 22 through an intervening layer of metalization, electrically conductive solder or resinous epoxy. The lead frame portions 26 are bonded to the substrate 22, such as by a conventional reflow type process where the metalization or solder or epoxy is liquified and subsequently cured to maintain a rigid bond between the lead frame portions 26 and the substrate 22.

After the lead frame portions 26 are securely bonded to the substrate 22, a temporary frame portion 27 is severed from a series of lead frame extensions 28 at and along the severance lines 29. When the frame portion 27 has been removed, the lead frame extensions 28 are deformed or bent at and along the bending lines 30. In such manner, a first series of lead frame extensions 31 extend in a direction normal to the lead frame portions 26 and first side 24 of substrate 22. Further, a second series of lead frame extensions 32 likewise extend in a direction normal to the attached lead frame portions 26 and first side 24 of substrate 22.

FIG. 7 illustrates a portion of the lead frame connector 25. Additional lead frame portions 26 and interconnected first and second lead frame extensions 31 and 32 may be initially attached to frame 27 and subsequently severed after being bonded to various locations of surface 24 of substrate 22. Such additional lead frame extensions will be designated with identical numbers primed for clarity of illustration.

Various additional circuit components may be attached to surface 24 of substrate 22. For example, the terminals 21 may be attached either to the substrate 22 or to an intervening lead frame portion 26, such as disclosed in the U.S. Pat. No. 4,215,235. Further, high heat generating components such as rectifiers or thyristors 23 or the like may be mounted upon lead frame portions 26 and interconnected in any one of a number of different constructions, such as shown in the U.S. Pat. No. 3,958,075. Various other circuits and circuit elements could be attached to surface 24 of substrate 22 such as through intervening lead frame portions 26 and/or conductive solder or metalization or thick film circuitry as preferred.

The substrate 22 and attached circuits 23 including the lead frame portions 26 form a circuit assembly 34 which may be assembled during one stage of construction.

A second substrate 40 provides a first side 41 which is spaced from wall 14 of housing 12. A second oppositely disposed side 42 of substrate 40 is spaced from surface 24 of substrate 22 through the series of interconnected lead frame extensions 31 and 31'. The substrate 40 may be formed of an electically insulating, heat conducting material similar to that of substrate 22. A first series of circuits 43 are attached to surface 41 of substrate 40 while a second series of circuits 44 are attached to surface 42. For example, the first circuits 43 may include a thick film circuit 45 which, in turn, may be connected to any one of a number of various circuit elements, such as screen printed film circuit elements or discrete elements attached to surface 41. The second circuits 44 could include, by way of illustration, a discrete component, such as a solenoid 46, a thick film circuit 47 or any one of a number of other elements which could be screen printed upon surface 42 or otherwise physically attached.

Each lead frame extension 31 and 31' includes an outer end 50 which secures and retains the substrate 40 in a fixed suspended position relative to substrate 22 and the wall surface 14. Each extension 50 includes a surface portion 51 which is securely retained within a corresponding opening 52 provided by substrate 40. An abutment 53 forms a ledge which engages surface 42 of substrate 40 and functions to support substrate 40 and maintain the spaced relationship between the substrates 40 and 22. An outwardly extending projection 54 is located adjacent surface 41 of substrate 40.

A first conductive solder 55 interconnects a selected lead frame extension 31 or 31' to the surface 41 of substrate 40. In addition, the conductive solder 55 may, in selected instances, form a current conducting path between a lead frame extension 31 or 31' and a circuit element, such as the thick film circuit 45 for example, located within the circuitry 43 provided at the surface 41 of substrate 40.

A second conductive solder 56 interconnects a selected lead frame extension 31 or 31' to the surface 42 of substrate 40. In certain instances, the conductive solder 56 may form a selective electrical connection between a lead frame extension 31 or 31' and circuitry 44 located at side 42 of substrate 40, such as with the thick film circuitry 47 illustrated in FIG. 6.

The lead frame extension 31 or 31' form a rigid connection to support substrate 40 in a spaced relationship with respect to substrate 22 and the wall surface 14. The use of a bonding agent, such as solder 55 and 56, insures the rigid interconnection which will withstand rough handling of the compact circuit package. In addition, the lead frame extensions 31 or 31' may conveniently provide electrical circuit interconnections between selected circuits 23 located along the surface 24 of substrate 22 and the circuits 43 located at the first side 41 of substrate 40 or the circuits 44 located along side 42 of substrate 40.

By selectively providing the lead frame extensions 31 and 31' and by selectively connecting such extensions to the circuits 43 or 44 via the conductive solder 55 or 56, a large plurality of circuit interconnections may be obtained to provide a large variety of circuit connection combinations in a compact circuit package.

The lead frame extensions 32 and 32' may be retained within apertures 18 to provide convenient external electrical access to the various circuits located within cavity 17, as attached to the substrates 22 and 40. For example, one of the lead frame extensions 32, such as extension 60, may be interconnected only to provide electrical connection to the circuits located upon substrate 22. The lead frame extension 61, however, is electrically connected through the lead frame portion 62 to one of the lead frame extensions 31, namely the extension 63, to provide external electrical connection to one or both of the circuits located on opposite sides of the substrate 40. In addition, the integral lead frame portion 62 joining the lead frame extension 61 and 63 may be electrically connected to the circuits 23 located upon surface 24 of substrate 22.

The substrate 40 and attached circuits 43 and 44 form a circuit sub-assembly 64 which may be assembled following the construction of the circuit sub-assembly 34.

The circuit sub-assemblies 34 and 64 as joined through the lead frame extensions 31 and 31' form a composite circuit assembly 65 which is assembled to the housing 12 in another stage of construction. Specifically, the circuits 23, 43 and 44 are inserted into the cavity 17 until a side edge 66 of substrate 22 engages an abutment 67 provided by the wall 16. Preferably a plurality of spaced abutments 67 or a continuous abutment 67 is employed to insure that uniform clamping pressure is applied to the side edge 66 of substrate 22 when a clamp 68, such as bolts or the like, is applied. Thus under one application, the clamp 68 engages the housing 12 and an external heat sink 69 to sandwich the substrate 22 between the housing 12 and the external heat sink 69. In such manner, substantial heat generated within the cavity 17 is readily withdrawn through the substrate 22 to the heat sink 69.

Good heat transfer is provided across the junction between the side 70 of substrate 22 and the heat sink 69 by providing substantial clamping pressures and eliminating barriers such as metalization, solder, epoxy or the like at such junction. Further, clamping at the side edge 66 of substrate 22 enables the use of substantial clamping pressures without subjecting the circuits 23 to forces which might otherwise cause damage or deter high efficiency operation.

When the composite circuit assembly 65 has been assembled to the housing 12, outer portions 71 of the lead frame extensions 32 and 32' will be located within the apertures 18 for ready external electrical connection. Such connections may supply operating power, control signals, sensing signals or whatever is desired, and one desirable application is illustrated in U.S. Pat. No. 4,218,724.

As an example, the lead frame extension 61 provides external electrical connection from the outer extension 71 to an inner portion 72 of the lead frame portion 62 which, in turn, is a part of the first circuits 23 located at the first side 24 of substrate 22. Further, the lead frame extension 63 provides an outer portion 73 which is interconnected to the substrate 40 and is electrically connected to a thick film circuit 47 located at side 42 of substrate 40 through the connecting solder 56.

In such construction, the lead frame extension 63 provides an electrical inter-connection between the circuits 23 at the substrate 22 and the circuits 43 or 44 located at the substrate 40. Further, the integral lead frame portion 62 joins the lead frame extensions 61 and 63 so that external signals at the outer portion 71 of lead frame extension 61 electrically communicates with the outer portion 73 of lead frame extension 63 and therefore with selected circuits 43 and/or 44 located at the substrate 40.

In like manner, the main power terminals 21 may be connected to selected circuits 43 and/or 44 located at the substrate 40 through the first lead frame extensions 31 and/or 31'. As illustrated in FIG. 6, a lead extension 75 of one of the first lead frame extensions 31' is connected to an extended portion 76 of one of the lead frame portions 26 upon which is secured the terminal 21. One desirable construction for securing the terminal 21 to the external portion 76 is shown in U.S. Pat. No. 4,215,235. In such manner, the main power supplied through terminals 21 may be selectively supplied either to the circuits 43 and/or 44 located at the substrate 40 or to the circuits 23 located at the substrate 22 or to all of the circuits if desired.

The compact circuit package provides plural lead frame extensions which not only maintain rigid support between spaced circuit containing substrates, but also provides a convenient means of selectively providing operating electrical current between and to a wide variety of circuits in a compact construction. With such construction, it may be possible to conduct up to approximately five amperes of current through the lead frame extensions which may withstand pulses up to approximately one hundred amperes.

Various modes of carrying out the invention are contemplated as being within the scope of the following claims which particularly point out and distinctly claim the subject matter which is regarded as the invention.

I claim:

1. A lead frame connector and a compact circuit package comprising a first substrate having a first side retaining a first circuit located within a cavity provided by a housing to conduct heat generated by said first circuit through said substrate to a point external to said cavity, at least a portion of said first substrate being located within said cavity and operatively connected to said housing, and a second substrate retaining a second circuit, wherein said lead frame connector comprises a first lead frame extension having a first portion electrically connected to said first circuit and a second portion electrically connected to said second circuit to conduct electrical current between said first and second circuits and engaging said first and second substrates to maintain said first and second substrates in spaced relationship with respect to each other, said first lead frame extension comprising a one-piece section integrally extending from said first substrate to said second substrate to support said second substrate regardless of any supporting engagement of said second substrate by said housing, and a second lead frame extension spaced from said first lead frame extension and having a first portion connected to one of said first and second substrates and a second portion spaced from the other of said first and second substrates and extending through an aperture within said housing to provide an external electrical connection for said circuit package.

2. The lead frame connector of claim 1, and including an integral lead frame portion interconnecting said first and second lead frame extensions to provide an external electrical connection for said first and second circuits.

3. The lead frame connector of claim 1, wherein said first lead frame extension first portion is connected to a main power terminal and said second portion is connected to one of said first and second circuits to conduct operating power to said compact circuit package.

4. The lead frame connector of claim 1, wherein said second portion of said first lead frame extension includes a ledge operatively engaging said second substrate to maintain said first and second substrates spaced from each other and an outer end projecting beyond said ledge to be located within a corresponding opening within said second substrate and forming an electrical connection with said second circuit.

5. The lead frame connector of claim 4, wherein said second circuit includes a printed circuit, and including an electrically conductive solder joining said lead frame outer end to said printed circuit to maintain said electrical connection therebetween.

6. A circuit package, comprising means providing a cavity to form a circuit receiving receptacle, a first circuit assembly including first substrate means operatively connected to said receptacle and providing a first side facing inside said cavity to conduct heat generated at said first side to a point external to said cavity and first circuit means operatively connected to said first side of said first substrate means for conducting electrical current resulting in generated heat at said first side, a second circuit assembly including second substrate means spaced from said first substrate means for providing a circuit retaining structure and second circuit means operatively connected to said second substrate means for conducting electrical current, and lead frame means connecting said first and second circuit assemblies to maintain said second circuit assembly spaced from said first circuit assembly and to conduct electrical current between said first and second circuit assemblies and including a first series of lead frame extensions extending normally from said first substrate means into said cavity and protruding through corresponding apertures within said receptacle to provide selectable external electrical connections to said first circuit means and a second series of lead frame extensions extending normally from said first substrate means and engaging said second substrate means to provide said current conduction between said first and second circuit assemblies, said second series of lead frame extensions comprising one-piece sections integrally extending from said first substrate means to said second substrate means to support said second substrate means regardless of any supporting engagement of said second substrate means by said receptacle.

7. A compact circuit package, comprising an electrically insulating housing having a cavity formed by a base plate surrounded by a peripheral wall terminating at a rim to form a circuit receiving receptacle, a circuit sub-assembly located within said cavity and including a first electrically insulating and heat conducting planar substrate having a side edge engaging an abutment located adjacent to said rim within said peripheral wall to limit the depth of entry of said circuit sub-assembly into said cavity and to substantially enclose said cavity by said first substrate, a first series of electrical circuits located at a first side of said first substrate facing said cavity and including circuit means operatively connected to said first substrate first side and operative to conduct substantial electrical energy thereby generating substantial heat which is conducted through said first substrate to a second side oppositely disposed from said first side to dissipate said generated heat at a point external to said cavity and lead frame means operatively connected to said first substrate first side to operatively conduct electrical energy to and between said first series of electrical circuits and including a first series of lead frame extensions extending normally from said first substrate into said cavity and protruding through corresponding apertures within said housing to provide external electrical connections to said circuit sub-assembly and a second series of lead frame extensions extending normally from said first substrate and terminating within said cavity, a second electrically insulating substantially planar substrate spaced from said first substrate and located within said cavity and including oppositely spaced first and second sides retaining a second series of electrical circuits including printed circuits, said second series of lead frame extensions each providing a ledge engaging said second substrate to maintain said first and second substrates spaced from each other and an outer end projection extending beyond said ledge and located within a corresponding opening within said second substrate, and means connecting said second series of lead frame extensions to said second substrate to retain said second substrate in a spaced relationship with respect to said housing and to electrically connect said second lead frame extensions and said second series of electrical circuits to provide a compact circuit module and the efficient transfer of electrical energy.

8. The compact circuit package of claim 7, wherein said connecting means includes first connection means to electrically connect a first selected number of said second lead frame extensions to said second circuits located at said first side of said second substrate and second connection means to electrically connect a second selected number of said second lead frame extensions to said second circuits located at said second side of said second substrate.

* * * * *